(12) United States Patent
Lee et al.

(10) Patent No.: US 8,589,828 B2
(45) Date of Patent: Nov. 19, 2013

(54) REDUCE MASK OVERLAY ERROR BY REMOVING FILM DEPOSITED ON BLANK OF MASK

(75) Inventors: Hsin-Chang Lee, Hsin-Chu Xian (TW); Chia-Jen Chen, Jhudong Township, Hsinchu County (TW); Lee-Chih Yeh, Hsinchu County (TW); Anthony Yen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/398,923

(22) Filed: Feb. 17, 2012

(65) Prior Publication Data

US 2013/0219350 A1    Aug. 22, 2013

(51) Int. Cl.
| | |
|---|---|
| G06F 17/50 | (2006.01) |
| G06F 19/00 | (2011.01) |
| G21K 5/00 | (2006.01) |
| G03F 1/00 | (2012.01) |
| G03F 1/22 | (2012.01) |
| G03F 1/20 | (2012.01) |
| G03F 1/42 | (2012.01) |

(52) U.S. Cl.
CPC ............ G06F 17/5081 (2013.01); *G06F 19/00* (2013.01); *G21K 5/00* (2013.01); *G03F 1/22* (2013.01); *G03F 1/20* (2013.01); *G03F 1/42* (2013.01)

USPC ................... 716/51; 716/54; 716/55; 700/98; 700/120; 700/121; 378/35; 430/5

(58) Field of Classification Search
CPC ....... G06F 17/5081; G06F 19/00; G21K 5/00; G03F 1/22; G03F 1/20; G03F 1/42
USPC ................... 716/51, 54, 55; 700/98, 120, 121; 378/35; 430/5
See application file for complete search history.

(56) References Cited

U.S. PATENT DOCUMENTS

| | | | |
|---|---|---|---|
| 8,063,402 B2 * | 11/2011 | Sokel et al. ................. 257/48 |
| 2001/0031506 A1 * | 10/2001 | Plat et al. .................. 438/14 |
| 2004/0115925 A1 * | 6/2004 | Tseng et al. ............... 438/633 |
| 2007/0011639 A1 * | 1/2007 | Pitts ......................... 716/11 |

* cited by examiner

*Primary Examiner* — Phallaka Kik
(74) *Attorney, Agent, or Firm* — Haynes and Boone, LLP (57) ABSTRACT

A method for reducing layer overlay errors by synchronizing the density of mask material in the frame area across the masks in a set is disclosed. An exemplary method includes creating a mask design database corresponding to a mask and containing a die area with one or more dies and a frame area outside the die area. Fiducial features within the frame area are identified, and from the fiducial features, an idle frame area is identified. A reference mask design, which corresponds to a reference mask configured to be aligned with the mask, is used to determine a reference density for the idle frame area. The idle frame area of the mask design database is modified to correspond to the reference density. The modified mask design database is then available for further use including manufacturing the mask.

20 Claims, 6 Drawing Sheets

REDUCE MASK OVERLAY ERROR BY REMOVING FILM DEPOSITED ON BLANK OF MASK

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed.

For example, mask overlay has become increasingly important as device size shrinks. ICs are typically assembled by layering features on a semiconductor wafer using a set of photolithographic masks. Each mask in the set has a pattern formed by transmissive or reflective regions. During a photolithographic exposure, radiation such as ultraviolet light passes through or reflects off the mask before striking a photoresist coating on the wafer. The mask transfers the pattern onto the photoresist, which is then selectively removed to reveal the pattern. The wafer then undergoes processing steps that take advantage of the shape of the remaining photoresist to create circuit features on the wafer. When the processing steps are complete, photoresist is reapplied and wafer is exposed using the next mask. In this way, the features are layered to produce the final circuit.

Regardless of whether a mask is error-free, if all or part of the mask is not aligned properly, the resulting features may not align correctly with adjoining layers. This can result in reduced device performance or complete device failure. One cause of alignment errors is mask stress. Stress may cause a mask to warp, affecting feature placement and creating layer overlay errors that cannot be resolved by conventional alignment techniques. The magnitude of the warping is a concern, but differences in warping between masks also contribute to overlay errors. For this reason, it is beneficial to equalize stress forces across the masks in the set. Warping may still occur, but the effects will be more consistent between masks and therefore between circuit layers. Thus, a method of synchronizing factors that contribute to warping has the potential to significantly reduce overlay errors and improve yield.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The present disclosure relates generally to mask manufacturing and optimization, and more particularly, to a method of reducing overlay errors by synchronizing the density of mask material in the frame area across the masks in a set.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1A:
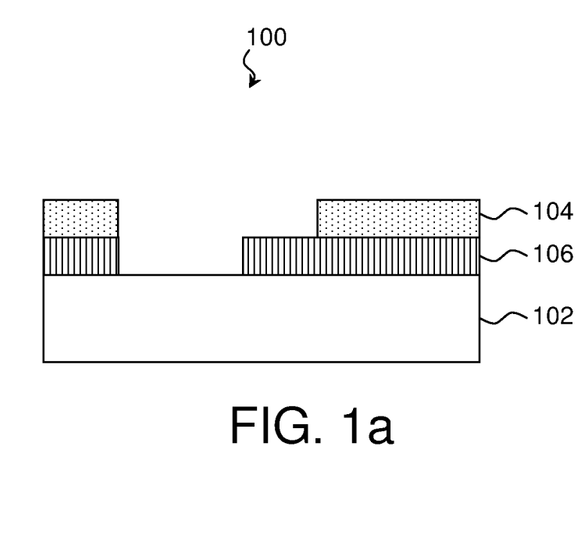
FIGS. 1a and 1b are diagrammatic sectional views of exemplary layers of a mask for IC manufacturing according to various aspects of the present disclosure.
Figure 1B:
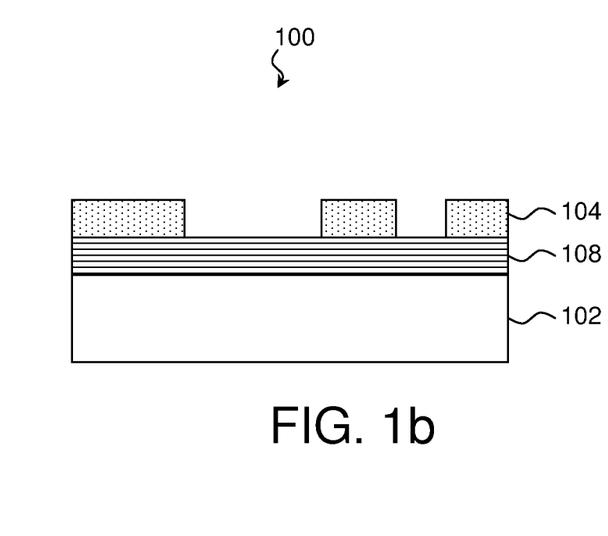

FIGS. 1a and 1b are diagrammatic sectional views of a mask 100 for IC manufacturing. The mask 100 includes a substrate 102. The substrate 102 may be made from soda-lime glass, fused silica, calcium fluoride ($CaF_2$), and/or other suitable material. A high degree of precision is required when forming the substrate 102 because imperfections distort the optical properties of the finished mask 100. Care is taken at every step in substrate formation to avoid and reduce optical defects.

Once a sufficiently planar substrate 102 is obtained, the layers are formed. These may include an absorption layer 104, one or more attenuating layers 106, and/or one or more reflective layers 108. The absorption layer 104 may include chromium (CR), MoSi, and/or other suitable materials. Typically, the absorption layer 104 is shaped using a mask writing technique such as electron beam writing, ion beam writing, photolithography such as binary photolithograph or phase shift photolithography coupled with etching such as wet or dry etching, and can be shaped using an alternative mask writing technique. The mask 100 may include attenuating layers 106 formed from such materials as metal silicide, metal nitride, iron oxide, inorganic material and/or other suitable materials. The mask 100 may also include one or more reflective layers 108 created using materials such as silicon/molybdenum, molybdenum/beryllium, and/or other suitable materials. For reasons that will be explored in detail later, although layers such as absorption layers 104, attenuating layers 106, and reflective layers 108 are essential to the mask 100, they contribute to warping that adversely impacts the mask's optical performance.

Figure 2:
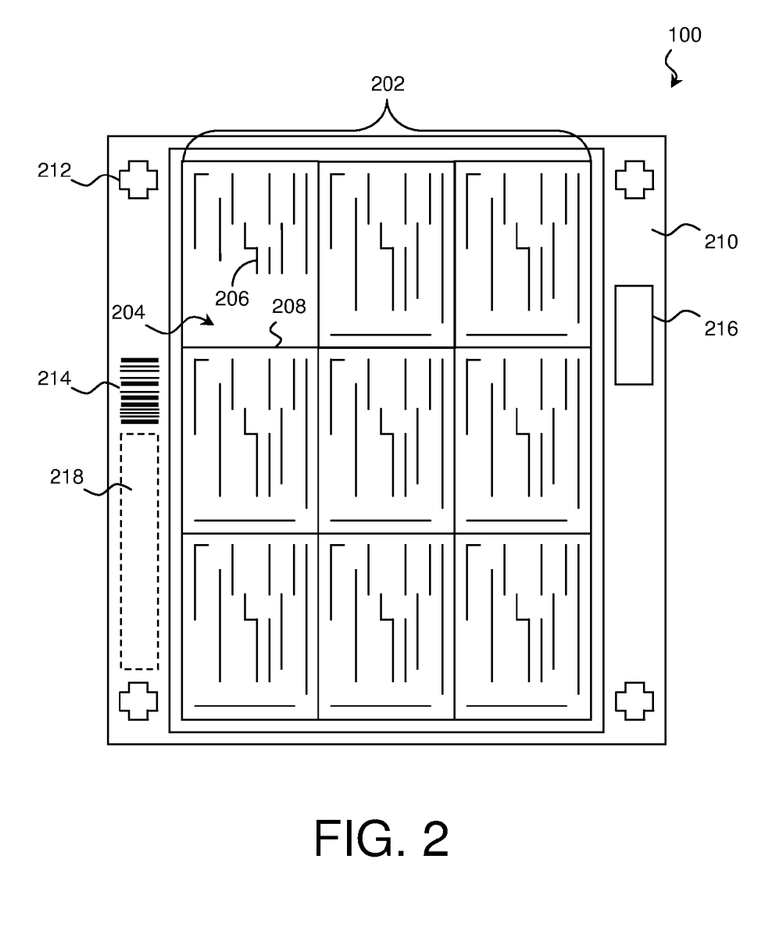
FIG. 2 is a diagrammatic top view of a mask for IC manufacturing according to various aspects of the present disclosure.

FIG. 2 is a diagrammatic top view of a mask 100 for IC manufacturing. The mask 100 contains a die area 202, which contains one or more dies 204 containing features 206. The dies 204 may be separated by scribe lines 208, sacrificial areas intended to be used when dicing the wafer. The mask 100 includes a frame area 210 around the die area 202, which contains the fiducial features, markings that are not part of an integrated circuit but are nonetheless beneficial to IC production. These fiducial features can include alignment marks 212, barcodes 214, identification marks 216, logos, and text. In many designs, the fiducial features do not utilize all the available frame area 210. The region of the frame area 210 that is devoid of fiducial features may be termed the idle frame area 218.

However, while the frame area 210 exists far enough from the dies 204 to avoid direct optical interference, the frame area 210 and particularly the idle frame area 218 can have an impact on features 206 within the die area 202 by warping the mask substrate 102. Despite the effort taken to create a planar substrate 102, the application of different materials upon the substrate 102, such as materials found in the absorption layers 104, attenuating layers 106, and reflective layers 108, introduces mask stress. One significant cause of mask stress is the difference in the coefficients of thermal expansion between the materials used for each layer. As the mask temperature changes, the layers expand at different rates. This creates shear stress between the layers. The layers are bound together and are unlikely to separate. However, the shear stress can cause the mask to warp to relieve the tension. Thermal shear stress is especially pernicious because a mask layer may be deposited at one temperature, etched at another, stored at another, and experience yet another range of temperatures during lithographic exposure. These thermal changes lead to uneven expansion within the mask, which creates stress and may cause the mask to warp.

The lithographic process requires the mask features 206 to fall on the wafer at precise locations. Warping alters where mask pattern features fall on the exposed wafer during lithographic exposure. This offset can result in misalignment between circuit features on different layers, thus creating defects known as overlay errors.

Warping contributes to offset and overlay errors. However, because overlay errors occur due to differences in alignment between layers, the differences in warping and offset between masks can have a greater impact on yield than the overall degree of warping. In fact, uniform warping can cancel out. If a first feature in a first layer is shifted due to mask warping yet an overlapping second feature in a second layer is shifted by a similar amount in the same direction, the masks may not produce an overlay defect. This may be true even if the warping is severe. On the other hand, if the first feature is shifted, but the second is not, then overlay issues will be more pronounced. Therefore, it is possible to reduce overlay errors by reducing overall stress, equalizing stress across masks, or some combination of both.

The idle frame area 218 is a significant contributor to these forces and to the resulting overlay errors. The idle frame area 218 is often large relative to other regions, lacks features to break up the layer materials, and thus, the idle frame area 218 can have significant layer density differences between masks. The size of the idle frame area 218 is a concern simply because it encompasses a large region. Shear stress is proportional to the contact area between the different mask materials. A large contact area correlates to a large stress force. Furthermore, because the idle frame area 218 lacks features, a given region of the idle frame area 218 will have a larger contact area than a region of the same size that contains features. In contrast, the circuit features present in the die area 202, for example, break up the layer material resulting in a less dense region and therefore less contact area. Additionally, because the idle frame area 218 does not necessarily serve a particular purpose, density may vary considerably between masks. The idle frame area 218 for a given mask may have a substrate 102 fully covered by an absorption layer 104 while the next mask in the series may have an idle frame area 218 where the substrate 102 is fully uncovered. This is common when one mask is configured for a positive resist and another mask is configured for a negative resist.

In the disclosed method, overlay errors from warping caused by the idle frame area 218 are reduced by adjusting the idle frame area 218 density of a mask based on a single reference density. In some embodiments, the reference density is determined by designating a mask in the set as a reference mask and utilizing its idle frame area 218 density to determine the reference density. The reference mask need not meet the reference density initially. In such a case, the reference mask may be adjusted after a reference density is determined. One or more remaining masks are then synchronized to the reference density of the reference mask. This results in more uniform stress and more uniform warping.

In some embodiments, the reference density is designed to reduce stress or warping in addition to synchronizing the effects among masks. In some cases, stress will be minimized with a low reference density (denoting less layer material within the idle frame area 218). The layer material contributes to mask substrate stress by its mechanical and thermal properties. Removing it reduces or eliminates the stress. However, a reference density of 0% may not always minimize stress or minimize warping. A layer material may actually contribute to the rigidity of the resulting mask, in which case density may be maximized to reduce warping. Alternately, the material may serve a more complicated structural role in conducting stress around and through the mask. In such a case, other reference densities may be considered.

Determining a reference density requires consideration of the manufacturing environment as well. The manufacturing methodology may not accommodate significant changes to the idle frame area 218 of all or a subset of the masks. A reference density can be selected that takes this in to account. The final reference density accounts for manufacturing requirements, equalizes stress among at least a subset of the masks in the series, and may further reduce overall mask warping.

In some embodiments, further consideration is needed to determine the proper idle frame area 218. Tools used during the manufacture and handling of the mask and tools used during wafer production may impose requirements on the idle frame area 218. For example, when a tool depends on a high-contrast region surrounding the fiducial feature, as is commonly the case with barcodes and alignment marks, it may not be possible to utilize the entire idle frame area 218 for stress equalization. In such a case, it can be useful to redefine the idle frame area 218 to exclude a padding region around the fiducial feature. Other tools, such as a mask-handling device, may require a padding region not associated with a fiducial feature or may require a padding region associated with a fiducial feature of another mask in the series. Furthermore, excluding other padding regions might result in more uniform stress or might reduce warping across masks in the set. In order to meet manufacturing requirements and to achieve an optimal reduction in warping, the idle frame area 218 is modified to exclude these padding regions.

After the idle frame area 218 has been defined and a reference density has been determined, the density of the layer material within the idle frame area 218 is modified based on the reference density. This may be performed during the design cycle by modifying the mask design database and subsequently creating a mask based on the modified mask design database. Alternately, it may be performed on an existing mask by altering the layer material within the idle frame area 218, using, for example, a deposition or an etching process. The possible modifications to alter the density of the idle frame area 218 of a mask design database or of a mask include applying or removing a repeating pattern, applying or removing a single global pattern, applying or removing a random pattern, applying or removing all the layer material in the idle frame area 218 or a region thereof, and/or another suitable modification. In some embodiments, the modifications are then repeated on other masks in the set. Whether the reference density is configured to reduce mask warping, to reduce mask stress, and/or to synchronize warping across masks in the set, modifying the density of the idle frame area 218 of the mask 100 based on the reference density can greatly reduce overlay errors.

Figure 3:
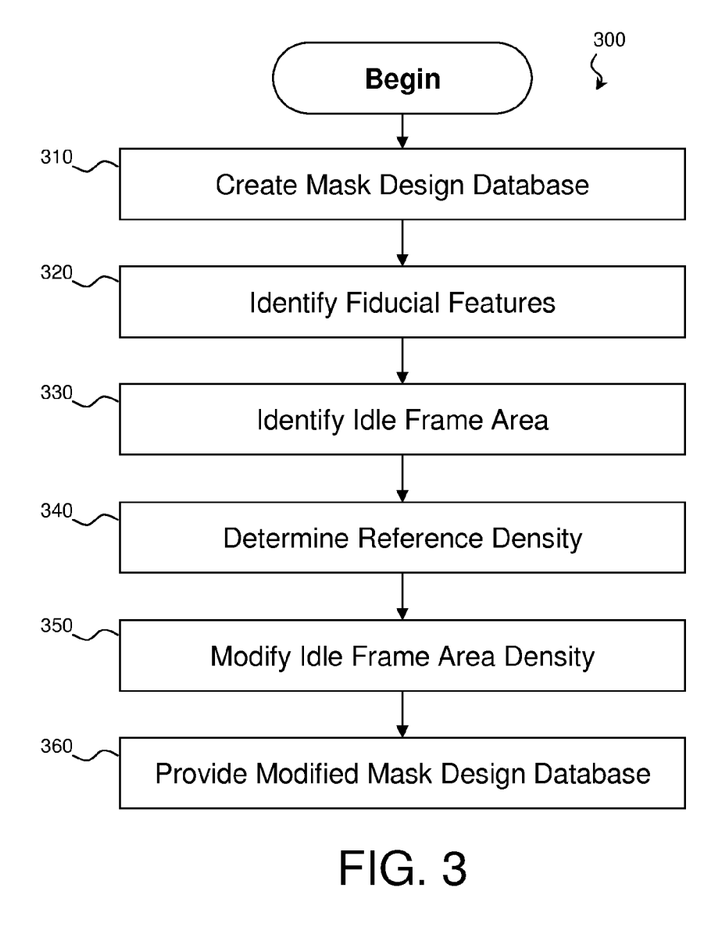
FIG. 3 is a flow chart of a method of mask design for reducing mask overlay error according to an embodiment of the present disclosure.

FIG. 3 is a flow chart of a method 300 of mask design for reducing mask overlay error according to an embodiment of the present disclosure. Additional steps can be provided before, during, and after the method 300, and some of the steps described can be replaced or eliminated for other embodiments of the method. Additionally, some steps may be performed concurrently with other steps. The method begins at block 310 where a mask design database is created. The mask design database contains data corresponding to a mask for IC production. The mask design database has a frame area, which may contain one or more fiducial features, and a die area, which contains one or more dies. In some embodiments, the mask design database is created using one or more die databases. The die databases contain dies that are to be included in the die area of the mask design database. In such embodiments, one or more die databases will be received and the dies within will be instantiated in the mask design database.

In block 320, the fiducial features are identified within the frame area of the mask design database. In some embodiments, identifying the fiducial features includes identifying padding regions around the fiducial features. In further embodiments, this may include identifying additional padding regions within the frame area that are not available for modification. These padding regions may arise from stress concerns, from tool requirements, from fiducial features of other masks in the set, or may be determined to reduce layer overlay errors. In block 330, an idle frame area is identified within the frame area. The idle frame area excludes the fiducial features, and, in some embodiments, excludes one or more padding regions. In block 340, a reference density is determined for a layer material within the idle frame area. The reference density corresponds to the density of an idle frame area of a reference mask. In some embodiments, the reference density is further configured to reduce mask stress or mask warping. In block 350, the density of the idle frame area is modified based on the reference density. This modification may be performed by adding or removing shapes corresponding to layer materials within the mask design database. This modification results in a modified mask design database. In block 360, the modified mask design database is provided. It may be provided for further design work, for manufacturing of the associated mask, or for other suitable purposes.

Figure 4:
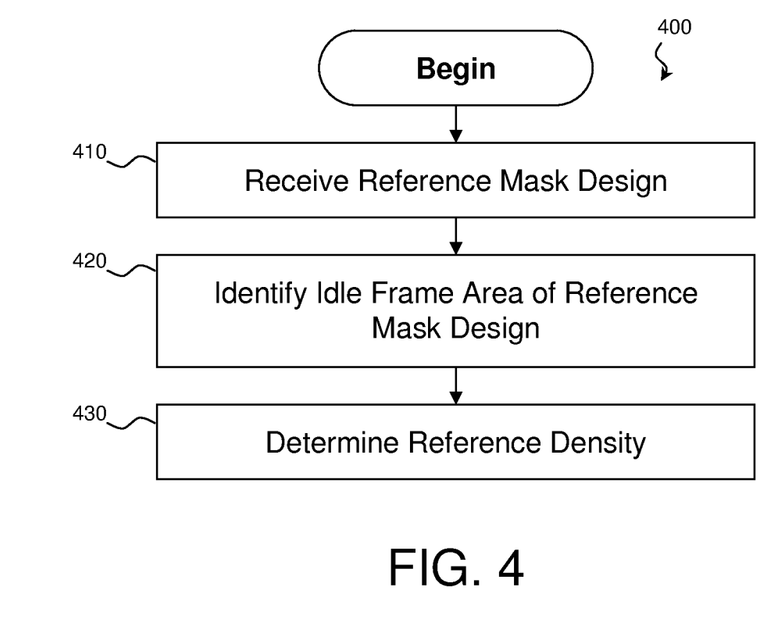
FIG. 4 is a flow chart that illustrates a method for determining a reference density for reducing mask overlay error according to an embodiment of the present disclosure.

FIG. 4 is a flow chart that illustrates a method for determining a reference density for reducing mask overlay error according to an embodiment of the present disclosure. The method 400 determines a reference density by analyzing a reference mask design. The method 400 may be performed, for example, as part of determining the reference density as performed in block 340 of the method illustrated in FIG. 3. In some embodiments, a reference mask design is received in block 410. The reference mask design corresponds to a reference mask for IC production and may be the reference mask itself, may be a design database corresponding to the reference mask, or may be another type of a mask design. The reference mask design has a frame area and a die area containing one or more dies. In block 420, an idle frame area of the reference mask design is identified. In some embodiments, the idle frame area of the reference mask design corresponds to the idle frame area of the mask design database to be modified. In block 430, a reference density is determined that corresponds to the density of the identified idle frame area of the reference mask design.

Figure 5:
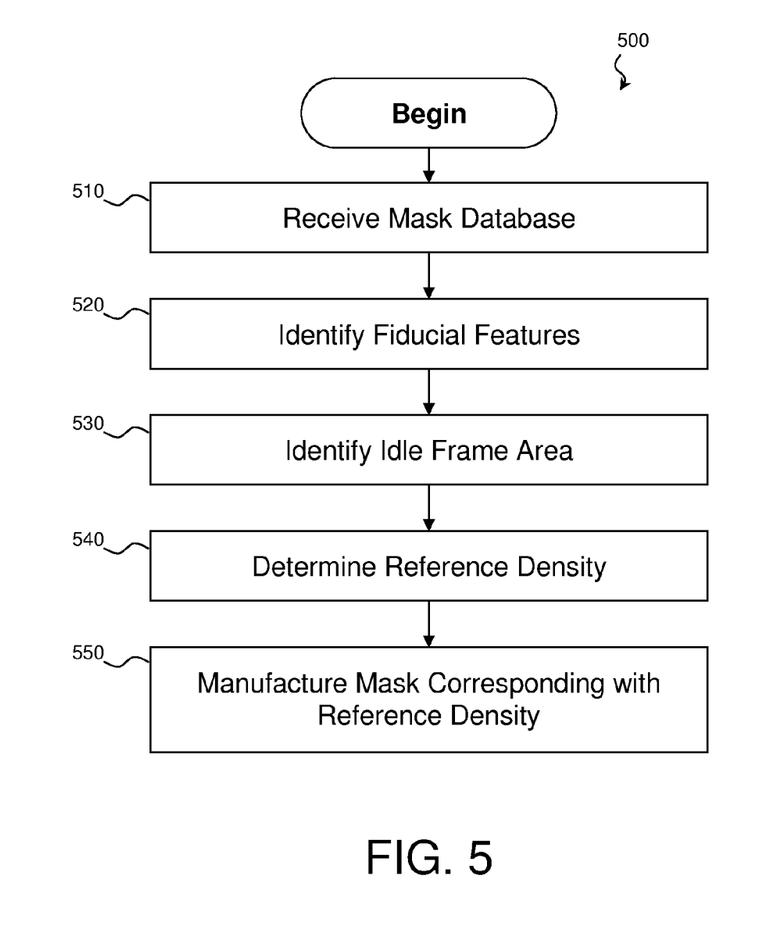
FIG. 5 is a flow chart of a method of mask creation for reducing mask overlay error according to an embodiment of the present disclosure.

FIG. 5 is a flow chart of a method 500 for mask construction according to an embodiment of the present disclosure. It is understood that additional steps can be provided before, during, and after the method 500, and some of the steps described can be replaced or eliminated for other embodiments of the method. The method 500 begins at block 510 where a mask design is received. A mask design is a representation of a mask. This includes a mask design database or another suitable virtual representation of a mask. A mask design may also be a representation of an existing mask, such as a mask image, or may be the mask itself. The mask design has a frame area containing one or more fiducial features and a die area containing one or more dies. In block 520, the fiducial features are identified. In some embodiments, identifying the fiducial features includes identifying padding regions around the fiducial features that may not be modified. In block 530, an idle frame area is identified within the frame area. In some embodiments, this includes identifying additional padding regions within the frame area that are not available for modification for reasons such as stress concerns, tool requirements, and/or fiducial features of other masks in the set. The idle frame area excludes the fiducial features, and, in some embodiments, excludes one or more padding regions. In block 540, a reference density is determined for a layer material within the idle frame area. The reference density is based on an idle frame area of a reference mask. In block 550, a mask is manufactured that corresponds to the mask design and that has an idle frame area density that corresponds to the reference density. This may be achieved by modifying the mask design and creating a mask from the modified mask design, or by altering an existing mask to meet the reference density.

Figure 6:
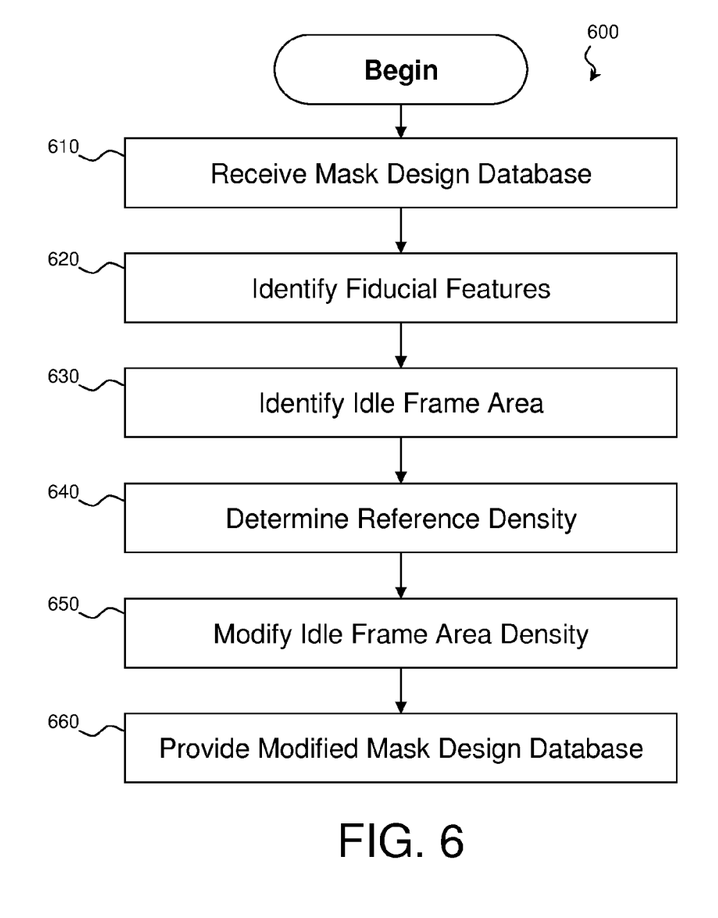
FIG. 6 is a flow chart of a method of mask design modification for reducing mask overlay error according to an embodiment of the present disclosure.

FIG. 6 is a flow chart of a method 600 of modifying a mask database for reducing mask overlay error according to an embodiment of the present disclosure. It is understood that additional steps can be provided before, during, and after the method 600, and some of the steps described can be replaced or eliminated for other embodiments of the method. The method begins at block 610 where a mask design database is received. The mask design database corresponds to a mask for IC production and contains a frame area that may have fiducial features and a die area with one or more dies. In block 620, any fiducial features are identified. In some embodiments, identifying the fiducial features includes identifying padding regions, which, along with the fiducial features, may not be modified. These padding regions may arise from stress concerns, tool requirements, fiducial features of other masks in the set, and/or other design considerations. In block 630, an idle frame area is identified within the frame area. The idle frame area excludes the fiducial features, and, in some embodiments, excludes the padding regions. In block 640, a reference density is determined for a layer material within the idle frame area. The reference density corresponds to the density of an idle frame area of a reference mask. In block 650, the density of the idle frame area is modified based on the reference density. This results in a modified mask design database. In block 660, the modified mask design database is provided. Providing may include providing the modified mask design database for further design work, for manufacturing of the associated mask, or providing for any other suitable purpose.

Thus, the present invention provides a method for reducing overlay error by synchronizing the density of mask material in the idle frame area across the masks in a set. In one embodiment, the method includes: creating a mask design database, wherein the mask design database corresponds to a mask and contains a frame area and a die area comprising one or more dies; identifying one or more fiducial features within the frame area; identifying an idle frame area within the frame area, wherein the idle frame area excludes the one or more fiducial features and wherein the idle frame area has a density; determining a reference density for the idle frame area based on a reference idle frame area of a reference mask design, wherein the reference mask design corresponds to a reference mask and wherein the mask is configured to be aligned with the reference mask; modifying the idle frame area of the mask design database such that the density of the idle frame area of the mask design database corresponds to the reference density; and providing the modified mask design database.

In a further embodiment, the method includes: receiving a mask design, wherein the mask design corresponds to a mask and contains a frame area and a die area comprising one or more dies; identifying one or more fiducial features within the frame area; identifying an idle frame area within the frame area, wherein the idle frame area excludes the one or more fiducial features and wherein the idle frame area has a density; determining a reference density for the idle frame area based on a reference idle frame area of a reference mask design, wherein the reference mask design corresponds to a reference mask and wherein the mask is configured to be aligned with the reference mask; and manufacturing the mask corresponding to the mask design such that the density of the idle frame area of the mask corresponds to the reference density.

In yet another embodiment, the method includes: receiving a mask design database, wherein the mask design database corresponds to a mask and contains a frame area and a die area comprising one or more dies; identifying one or more fiducial features within the frame area; identifying an idle frame area within the frame area, wherein the idle frame area excludes the one or more fiducial features and wherein the idle frame area has a density; determining a reference density for the idle frame area based on a reference idle frame area of a reference mask design, wherein the reference mask design corresponds to a reference mask and wherein the mask is configured to be aligned with the reference mask; modifying the idle frame area of the mask design database such that the density of the idle frame area of the mask design database corresponds to the reference density; and providing the modified mask design database.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for mask design, the method comprising:
   creating a mask design database, wherein the mask design database corresponds to a mask and contains a frame area and a die area comprising one or more dies;
   identifying one or more fiducial features within the frame area;
   identifying an idle frame area within the frame area, wherein the idle frame area excludes the one or more fiducial features and wherein the idle frame area has a density;
   determining a reference density for the idle frame area based on a reference idle frame area of a reference mask design, wherein the reference mask design corresponds to a reference mask and wherein the mask is configured to be aligned with the reference mask;
   modifying, using a computer, the idle frame area of the mask design database such that the density of the idle frame area of the mask design database corresponds to the reference density; and
   providing the modified mask design database in a format accessible by a mask making tool.

2. The method of claim 1, wherein creating the mask design database comprises:
   receiving a die database corresponding to a die;
   creating the mask design database;
   characterizing the die area within the mask design database;
   instantiating within the mask design database one or more instances of the die disposed within the die area;
   characterizing the frame area within the mask design database;
   instantiating within the mask design database one or more fiducial features disposed within the frame area.

3. The method of claim 1, wherein determining the reference density for the idle frame area based on the reference idle frame area of the reference mask design comprises:
   receiving the reference mask design having a frame area;
   identifying the reference idle frame area within the frame area of the reference mask design, the reference idle frame area corresponding to the idle frame area of the mask design database; and
   determining the reference density based on the reference idle frame area.

4. The method of claim 1, wherein the reference density is configured to reduce mask warping.

5. The method of claim 1, further comprising identifying one or more padding areas disposed proximately to the one or more fiducial features, wherein the idle frame area further excludes the one or more padding areas.

6. The method of claim 1, further comprising identifying one or more padding areas configured to reduce mask warping, wherein the idle frame area further excludes the one or more padding areas.

7. The method of claim 1, wherein a third mask has a frame area containing a third mask fiducial feature, the method further comprising identifying a padding area corresponding to the third mask fiducial feature, wherein the idle frame area further excludes the padding area.

8. A method for mask construction, the method comprising:
- receiving a mask design, wherein the mask design corresponds to a mask and contains a frame area and a die area comprising one or more dies;
- identifying one or more fiducial features within the frame area;
- identifying an idle frame area within the frame area, wherein the idle frame area excludes the one or more fiducial features and wherein the idle frame area has a density;
- determining a reference density for the idle frame area based on a reference idle frame area of a reference mask design, wherein the reference mask design corresponds to a reference mask and wherein the mask is configured to be aligned with the reference mask; and
- manufacturing the mask corresponding to the mask design such that the density of the idle frame area of the mask corresponds to the reference density.

9. The method of claim 8, wherein manufacturing the mask corresponding to the mask design comprises:
- modifying the idle frame area of the mask design such that the density of the idle frame area of the mask design corresponds to the reference density; and
- thereafter manufacturing the mask configured to correspond to the modified mask design.

10. The method of claim 8, wherein manufacturing the mask corresponding to the mask design comprises:
- manufacturing the mask corresponding to the mask design; and
- thereafter modifying the idle frame area of the mask such that the density of the idle frame area of the mask corresponds to the reference density.

11. The method of claim 8, wherein determining the reference density for the idle frame area based on the reference mask design comprises:
- receiving the reference mask design having a frame area;
- identifying the reference idle frame area within the frame area of the reference mask design, the reference idle frame area corresponding to the idle frame area of the mask design database; and
- determining the reference density based on the reference idle frame area.

12. The method of claim 8, wherein the reference density is configured to reduce mask warping.

13. The method of claim 8, further comprising identifying one or more padding areas disposed proximately to the one or more fiducial features, wherein the idle frame area further excludes the one or more padding areas.

14. The method of claim 8, further comprising identifying one or more padding areas configured to reduce mask warping, wherein the idle frame area further excludes the one or more padding areas.

15. The method of claim 8, wherein a third mask has a frame area containing a third mask fiducial feature, the method further comprising identifying a padding area corresponding to the third mask fiducial feature, wherein the idle frame area further excludes the padding area.

16. A method for modifying a mask design database, the method comprising:
- receiving a mask design database, wherein the mask design database corresponds to a mask and contains a frame area and a die area comprising one or more dies;
- identifying one or more fiducial features within the frame area;
- identifying an idle frame area within the frame area, wherein the idle frame area excludes the one or more fiducial features and wherein the idle frame area has a density;
- determining a reference density for the idle frame area based on a reference idle frame area of a reference mask design, wherein the reference mask design corresponds to a reference mask and wherein the mask is configured to be aligned with the reference mask;
- modifying, using a computer, the idle frame area of the mask design database such that the density of the idle frame area of the mask design database corresponds to the reference density; and
- providing the modified mask design database in a format accessible by a mask making tool.

17. The method of claim 16, wherein determining the reference density for the idle frame area based on the reference mask design comprises:
- receiving the reference mask design having a frame area;
- identifying the reference idle frame area within the frame area of the reference mask design, the reference idle frame area corresponding to the idle frame area of the mask design database; and
- determining the reference density based on the reference idle frame area.

18. The method of claim 16, wherein the reference density is configured to reduce mask warping.

19. The method of claim 16, further comprising identifying one or more padding areas disposed proximately to the one or more fiducial features, wherein the idle frame area further excludes the one or more padding areas.

20. The method of claim 16, further comprising identifying one or more padding areas configured to reduce mask warping, wherein the idle frame area further excludes the one or more padding areas.

* * * * *